United States Patent
Pan et al.

(10) Patent No.: US 10,483,119 B1
(45) Date of Patent: Nov. 19, 2019

(54) SELF-ALIGNED DOUBLE PATTERNING (SADP) METHOD

(71) Applicant: Taiwan Semiconductor Manufacturing Co., Ltd., Hsin-Chu (TW)

(72) Inventors: Jui-Yu Pan, Neipu Township (TW); Kuo-Chyuan Tzeng, Chu-Pei (TW); Lee-Chuan Tseng, New Taipei (TW); Ying-Hua Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/161,421

(22) Filed: Oct. 16, 2018

Related U.S. Application Data

(60) Provisional application No. 62/733,922, filed on Sep. 20, 2018.

(51) Int. Cl.
  *H01L 21/308* (2006.01)
  *H01L 21/8234* (2006.01)
  *H01L 21/033* (2006.01)

(52) U.S. Cl.
  CPC ...... *H01L 21/3086* (2013.01); *H01L 21/0337* (2013.01); *H01L 21/823468* (2013.01)

(58) Field of Classification Search
  USPC ........................................................ 438/696
  See application file for complete search history.

(56) References Cited

U.S. PATENT DOCUMENTS 9,236,481 B1 * 1/2016 Zang ................. H01L 29/66795

* cited by examiner

*Primary Examiner* — Roberts P Culbert
(74) *Attorney, Agent, or Firm* — Eschweiler & Potashnik, LLC

(57) ABSTRACT

The present disclosure relates to integrated circuit device manufacturing processes. A self-aligned double patterning method is provided. In the method, a lithography process for line cut that determines the locations of line termini is performed after forming a spacer layer alongside the mandrel and prior to stripping the mandrel. The lithographic mask for the line cut is aligned to the mandrel and the spacer layer using a mark made of the mandrel material and the spacer material. Compared to the previous approach where the line cut process is performed after the mandrel removal, in the disclosed approach, the line termini mask is made of the mandrel material and the spacer material, and is more distinguishable compared to a mark made of just the spacer material. Thereby, the methods provide robust photo alignment signal for the line cut photolithography and precise positioning of the line termini mask.

20 Claims, 11 Drawing Sheets

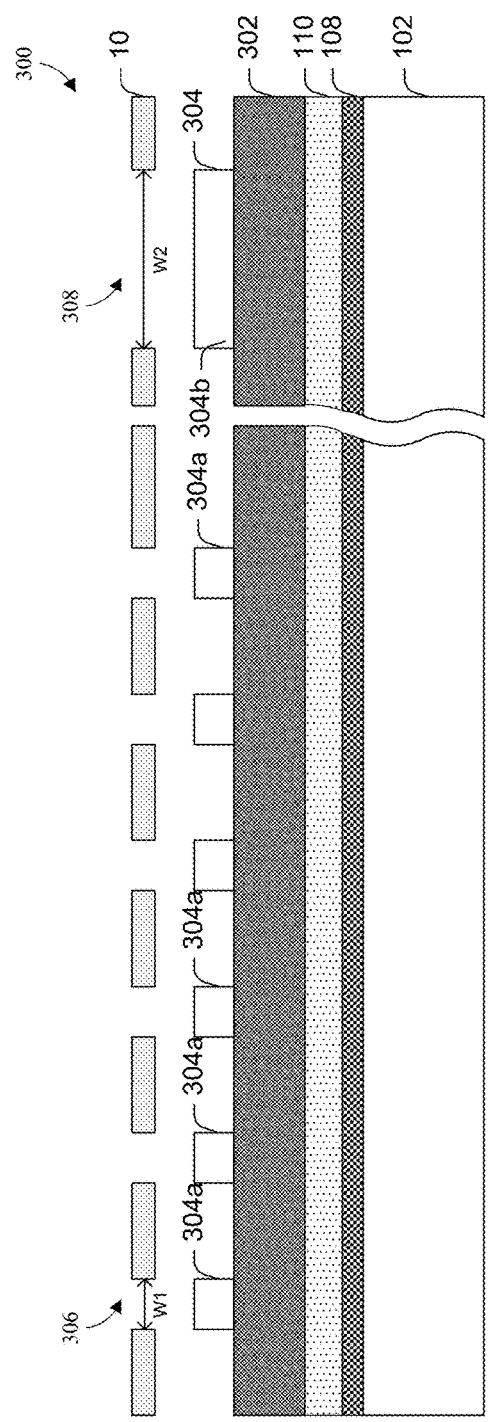
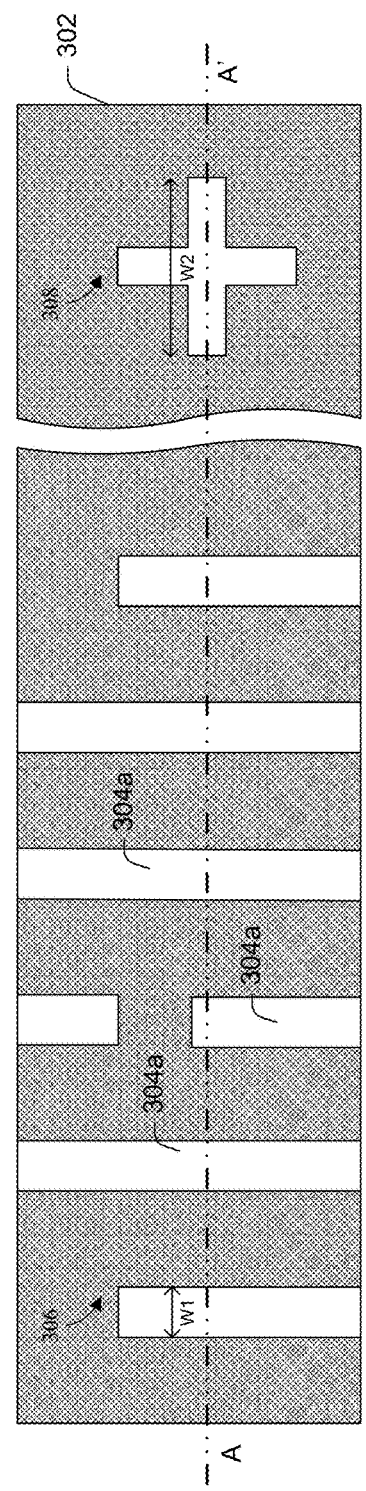
Fig. 3
Fig. 4

SELF-ALIGNED DOUBLE PATTERNING (SADP) METHOD

REFERENCE TO RELATED APPLICATION

This Application claims priority to U.S. Provisional Application No. 62/733,922 filed on Sep. 20, 2018, the contents of which are hereby incorporated by reference in their entirety.

BACKGROUND

In conventional photolithography, a photoresist is exposed to light through a lithographic mask. The photoresist is modified by the exposure in such a way that either the exposed or unexposed portions of the resist can be removed during subsequent development. Any photolithographic process has limitations, whereby there is a critical dimension below which features are too fine to be resolved. That resolution limit is a critical barrier in reducing the scale of integrated circuit devices such that additional process steps are needed to form the desired features. Self-Aligned Double Patterning (SADP) schemes use precise coatings deposited as "spacers" on the sidewalls of mandrels made from developed photoresist or a sacrificial material at a given pitch, such that after selective mandrel etching the spacers pitch-split.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-20 are a series of paired plan and cross-sectional views showing a method for manufacturing an integrated circuit device (e.g., the integrated circuit device of FIG. 1) according to some embodiment.

DETAILED DESCRIPTION

Figure 1:
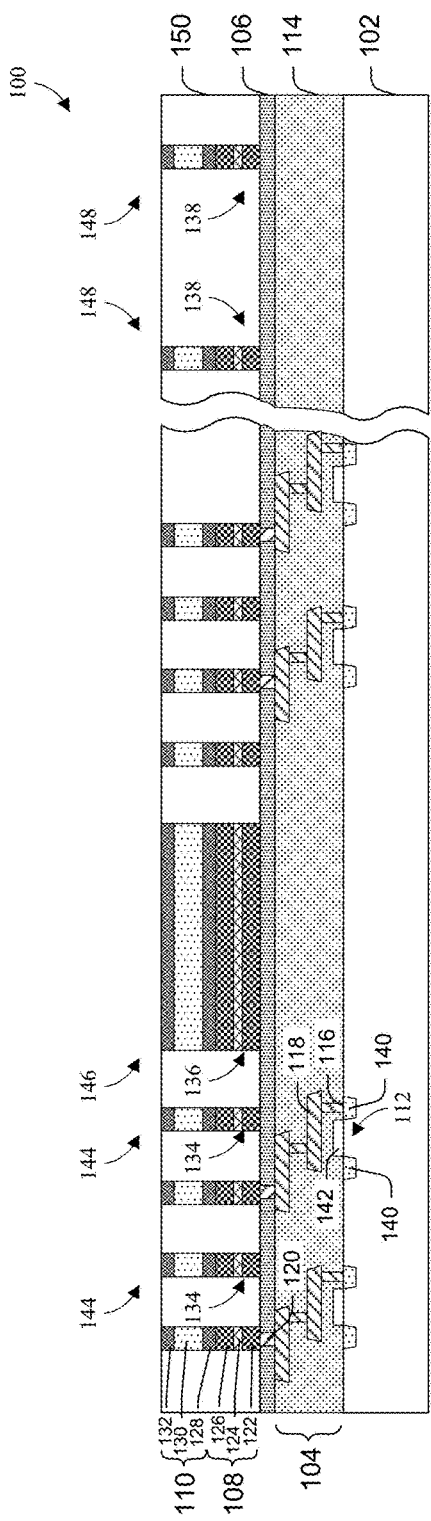
FIG. 1 illustrates a cross-sectional view of an example integrated circuit device according to some embodiment.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first dielectric layer" described in connection with a first figure may not necessarily corresponding to a "first dielectric layer" described in connection with another figure.

Self-aligned double patterning is a technique for forming features having a finer pitch than would be possible by the direct application of a photolithographic process. Self-aligned double patterning involves forming a mandrel having line-shaped features. A spacer formation process is then used to form spacers on the sides of the mandrel features. The mandrel is then stripped leaving the spacers standing on a masking layer to transfer line-shaped features to the masking layer for further processing. Prior to patterning the masking layer according to the spacers, a "cut" process is performed to define termini of the line-shape features. In more detail, the spacers may be formed by forming a spacer layer covering sidewall and top surfaces of the mandrel followed by a vertical etching process to remove lateral portions of the spacer layer. The spacer layer is then left not only alongside both sides of the line-shaped mandrel features, but also alongside the ends of the mandrel features. The spacer layer located at the ends portion of the line-shaped features needs to be removed before patterning the masking layer according to the spacers. One way to patterning the spacer layer is performing a photolithography process after the mandrel removal to selectively remove the spacer layer from the ends portion of the line-shaped features. The lithographic mask for the cut process needs to be aligned to the spacer layer in order to get accurate removal of the ends portion of the spacer layer. However, it is found that this alignment is hard to achieve due to low distinguishability of the spacer layer when covered by the photoresist for the cut lithography.

Figure 7:
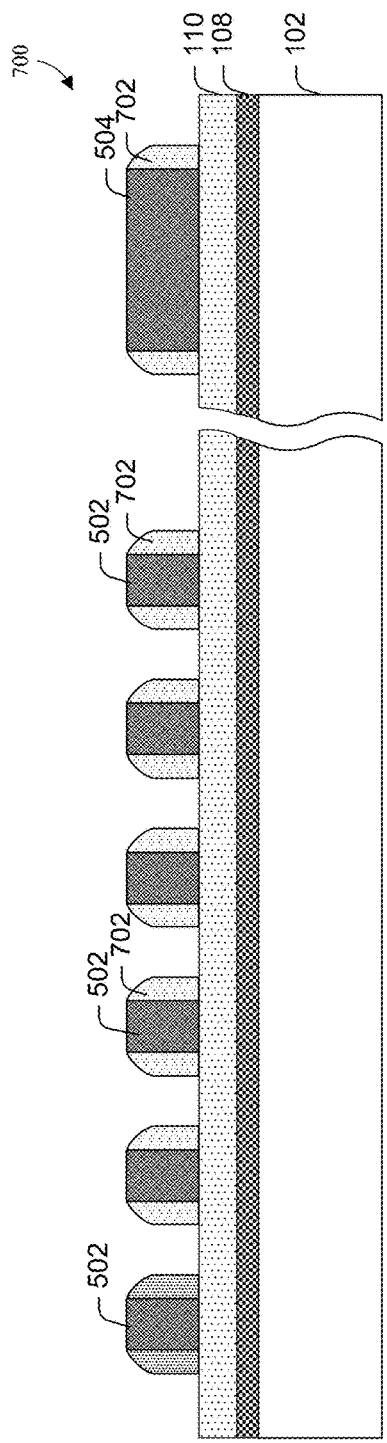
Figure 8:
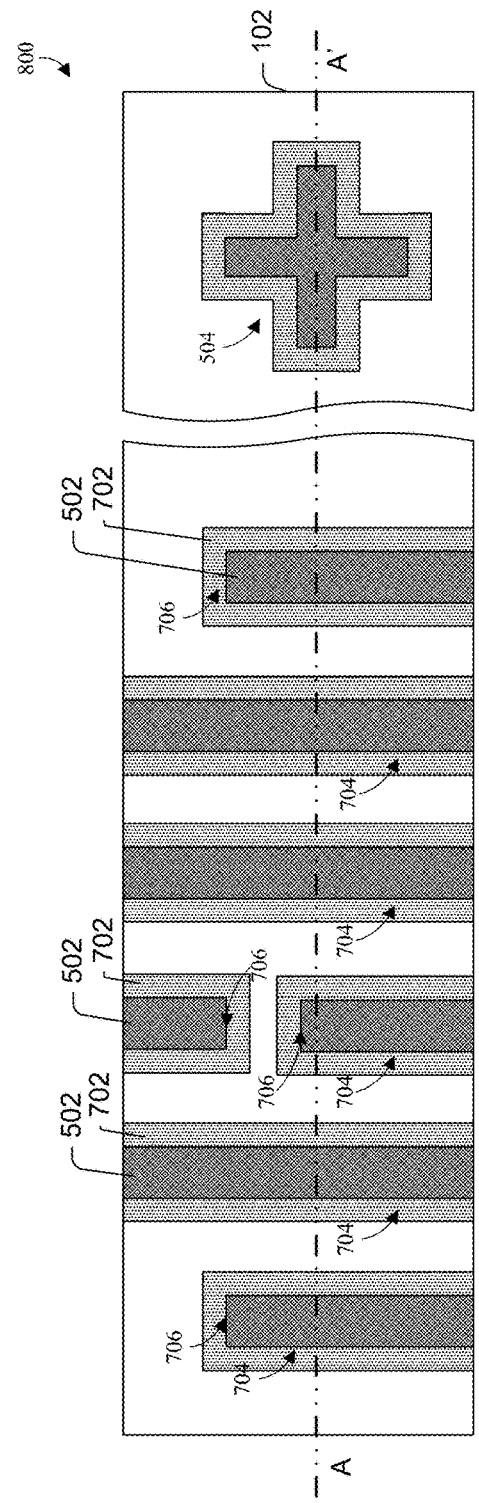
Figure 13:
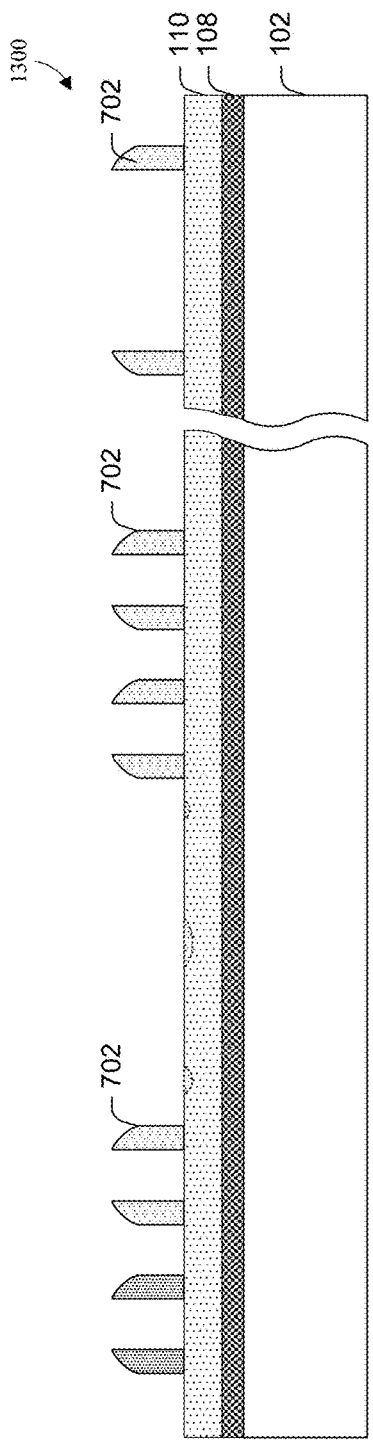
Figure 14:
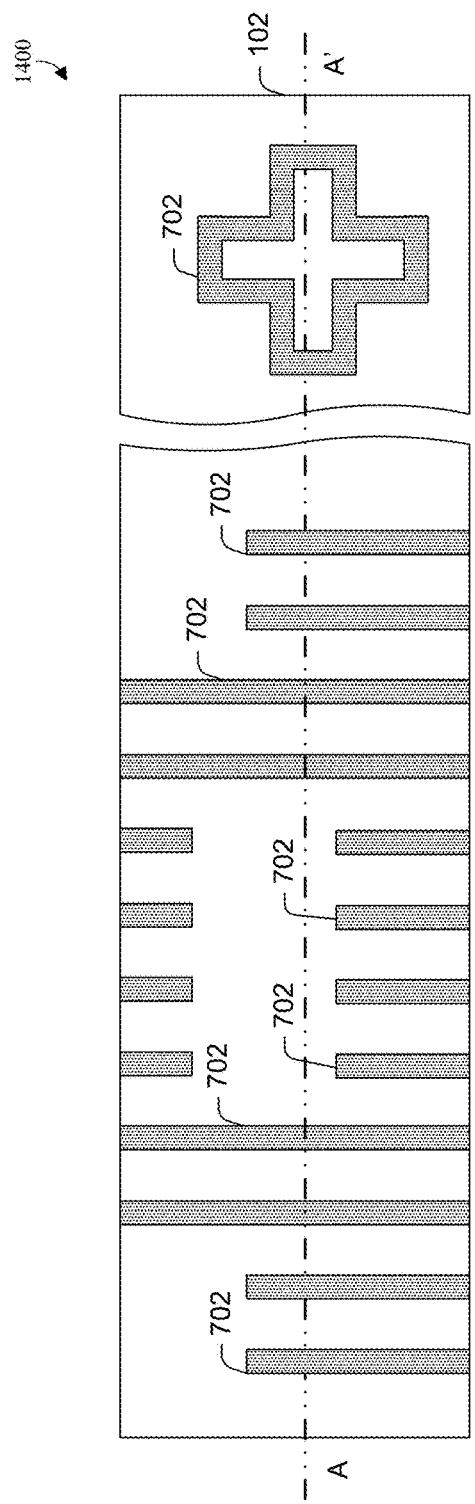

The present disclosure relates to integrated circuit device manufacturing processes. A self-aligned double patterning method is provided and can be used to manufacture semiconductor devices such as memory cells (e.g. magnetoresistive random access memory (MRAM) cells, magnetic tunnel junction (MTJ) structures, or resistive random access memory (RRAM) cells), logic devices, fins of finFET devices, etc., and can also be used in back-end-of-line (BEOL) processing and other stages of integrated circuit device manufacturing. In the method, a lithography process for line cut (for example, the lithography process shown in FIG. 9 and FIG. 10 and described later) determines the locations of line termini and is performed after forming a spacer layer alongside the mandrel (for example, forming a spacer layer 702 alongside a mandrel 502 as shown in FIG. 7 and FIG. 8 and described later) and prior to stripping the mandrel (for example, striping the mandrel 502 as shown in FIG. 13 and FIG. 14 and described later). The lithographic mask (for example, the lithography mask 20 shown in FIG. 9 and FIG. 10 and described later) for the line cut is aligned to the mandrel and the spacer layer using a line termini mark made of the mandrel material and the spacer material. In a previous approach, the line cut process is performed after the mandrel removal and the line termini mark is made of the spacer material. In comparison, in the disclosed approach, the line termini mark is made of the mandrel material and the spacer material, and is more distinguishable compared to a mark made of just the spacer material. Thereby, the methods provide robust photo alignment signal for the line cut photolithography and precise positioning of the line termini mask.

FIG. 1 provides a cross-sectional view of an example integrated circuit device 100 according to some embodiment. In FIG. 1, a transistor device 112 is disposed over a substrate 102. The substrate 102 may be, for example, a bulk substrate (e.g., a bulk silicon substrate) or a silicon-on-insulator (SOI) substrate. The transistor device 112 may comprise a gate electrode 142 disposed over the substrate 102 and separated from the substrate 102 by a gate dielectric. A pair of source/drain regions 140 is disposed alongside the gate electrode 142 within the substrate 102. The gate electrode 142 may be, for example, doped polysilicon or a metal, such as titanium nitride or tantalum nitride. The gate dielectric may be, for example, an oxide, such as silicon dioxide. The pair of source/drain regions 140 may be highly doped. An interconnect structure 104 is disposed over the substrate 102. The interconnect structure 104 comprises a plurality of conductive lines 118 and conductive vias 116 alternatively stacked one on another and surrounded by a first inter layer dielectric (ILD) layer 114. In some embodiments, the conductive lines 118 and conductive vias 116 may be comprised of copper, for example. The first ILD layer 114 may comprise silicon dioxide, for example. The first ILD layer 114 may also be, for example, a low-k dielectric (i.e., a dielectric with a dielectric constant k less than silicon dioxide) or an extreme low-k dielectric (a dielectric with a dielectric constant k less than about 2). The etch stop layer 106 may comprise a silicon carbide layer, for example. The etch stop layer 106 may also comprise silicon nitride, silicon oxide, or one or more layers of composite dielectric films. The interconnect structure 104 is electrically coupled to a source/drain region 140 of the transistor device 112. A conductive contact 120 reaches on one of the conductive lines 118 of the interconnect structure 104 and is surrounded by an etch stop layer 106 overlying the interconnect structure 104. The conductive contact 120 may be, for example, a metal, such as copper, gold, or tungsten. A second ILD layer 150 is disposed over the etch stop layer 106. In some embodiments, the second ILD layer 150 may comprise a different material than the first ILD layer 114. For example, in some embodiments, the first ILD layer 114 may comprise a dielectric material having a first dielectric constant (e.g., a low-k dielectric layer) and the second ILD layer 150 may comprise dielectric material having a second dielectric constant (e.g., a low-k dielectric layer) that is lower than the first dielectric constant.

In some embodiments, a device layer 108 is disposed over the etch stop layer 106 and within the second ILD layer 150. The device layer 108 may contain multiple layers and structures made of different materials. For example, the device layer 108 may comprise a device structure 134 electrically coupled to the conductive contact 120. As an example, the device layer 108 may have a thickness in a range of from about 40 nm to about 150 nm. As an example, the etch stop layer 106 may have a thickness in a range of from about 30 nm to about 80 nm. The device structure 134 may be a resistive memory cell and may comprise a top electrode 126 and a bottom electrode 122 separated by a resistance switching dielectric 124. The top electrode 126 and the bottom electrode 122 of the device structure 134 are a conductive material, such as titanium nitride. The top electrode 126 and the bottom electrode 122 may also comprise, for example, titanium, tantalum, tantalum nitride, platinum, iridium, tungsten, ruthenium, or the like. As an example, the top electrode 126 may have a thickness in a range of from about 10 nm to about 50 nm, the bottom electrode 122 may have a thickness in a range of from about 10 nm to about 50 nm, and the resistance switching dielectric 124 may have a thickness in a range of from about 15 nm to about 30 nm. In some embodiments, the device structure 134 is a magnetoresistive random access memory (MRAM) cell and the resistance switching dielectric 124 can comprise a magnetic tunnel junction (MTJ) structure having a bottom ferromagnetic layer and a top ferromagnetic layer separated by a tunnel barrier layer. In some other embodiments, the device structure 134 is a resistive random access memory (RRAM) cell and the resistance switching dielectric 124 can comprise a RRAM dielectric layer. The resistance switching dielectric 124 may be a high-k layer (i.e., a layer with a dielectric constant k greater than 3.9), for example, tantalum oxide, tantalum hafnium oxide, tantalum aluminum oxide, or another material that includes tantalum, oxygen, and one or more other elements. During operation of the device structure 134, voltages are applied between the top electrode 126 and bottom electrode 122 to read, set or erase the memory cell by forming or breaking one or more conductive filaments of the resistance switching dielectric 124. Thus the device structure 134 can have a variable resistance in a comparatively low or high resistance state to stand for low or high bit status, for example.

The device layer 108 may further comprises a dummy structure 136 separated from the device structure 134. The device layer 108 may further comprises a device level mark structure 138 separated from the device structure 134 and the dummy structure 136. In some embodiments, the dummy structure 136 and the device level mark structure 138 may respectively has same layers of compositions as the device structure 134. The device structure 134, the dummy structure 136, and the device level mark structure 138 may have aligned upper surfaces. A masking layer 110 is disposed over the device layer 108. The masking layer 110 may comprise a device mask 144 disposed on the device structure 134 and having a sidewall vertically aligned to that of at least an upper portion of the device structure 134. The masking layer 110 may further comprise a dummy mask 146 disposed on the dummy structure 136 and having a sidewall vertically aligned to that of the dummy structure 136. The masking layer 110 may further comprise a mask level mark 148 disposed on the device level mark structure 138 and having a sidewall vertically aligned to that of the device level mark structure 138. In some embodiments, the masking layer 110 may comprise a first silicon nitride (SiN) layer 128, an amorphous carbon (APF) layer 130 disposed over the first SiN layer 128, and a second silicon nitride (SiN) layer 132 disposed over the APF layer 130. As an example, the masking layer 110 may have a thickness in a range of from about 70 nm to about 350 nm. The first silicon nitride (SiN) layer 128 may have a thickness in a range of from about 70 nm to about 350 nm. The amorphous carbon (APF) layer 130 may have a thickness in a range of from about 50 nm to about 150 nm. The second silicon nitride (SiN) layer 132 may have a thickness in a range of from about 30 nm to about 100 nm. Though not shown in the figure, a top electrode via may be arranged through the masking layer 110 to electrically connect the top electrode 126 to an upper metal line or other connection structures. The top electrode via may be, for example, a conductive material, such as such as copper, aluminum, or tungsten. In some alternative embodiments, the masking layer 110 may be removed from the final device.

Figure 2:
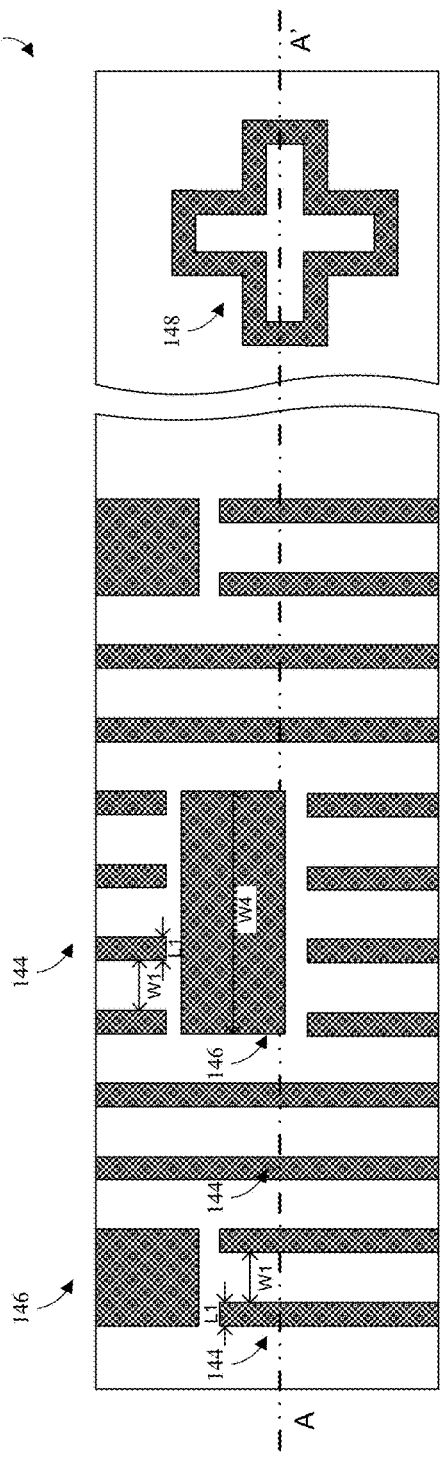
FIG. 2 provides a partial plan view of the device illustrated by FIG. 1 according to some embodiment, FIG. 1 can be taken along the line A-A'.

FIG. 2 provides a partial plan view of an integrated circuit device 200 according to some embodiment. FIG. 2 can also serve as a partial plan view of the device 100 illustrated by FIG. 1 according to some embodiment, where FIG. 1 can be taken along the line A-A'. As shown in FIG. 2, the integrated circuit device 200 may comprise a device structure 134, a dummy structure 136, and a device level mark structure 138 spaced apart from one another. The device structure 134 may comprise line-shaped structures that are in parallel from one another and spaced from one another by a gap width W1. The line-shaped structure may have a unit line width L1. In some embodiments, the gap width W1 may be greater than the unit line width L1. The dummy structure 136 may comprise a planar shape structure that has a planar width W4. The planar width W4 may be a sum of multiple of the unit line width L1 and the gap width W1. For example, as shown in FIG. 1, the planar width W4 may be a sum of four times of the unit line width L1 and three times of the gap width W1. The device level mark structure 138 may comprise can be any applicable shape for marking purpose, such as a plurality of lines with different distances, polygons, etc. . . . In some embodiments, the device level mark structure 138 may comprise lines with a width substantially equal to the unit line width L1. The device structure 134 may comprise memory cells (e.g. magnetoresistive random access memory (MRAM) cells, magnetic tunnel junction (MTJ) structures, or resistive random access memory (RRAM) cells), logic devices, fins of finFET devices, etc. . . . . The device structure 134, the dummy structure 136, and the device level mark structure 138 may be separated by an ILD layer 150. In some embodiments, the device structure 134, the dummy structure 136, and the device level mark structure 138 may have same layers of compositions. The ILD layer 150 may be, for example, oxide, a low-k, or an extreme low-k dielectric.

FIGS. 3-20 illustrate a series of cross-sectional views of some embodiments of an integrated circuit device at various stages of manufacture.

As shown in cross-sectional view 300 of FIG. 3 and plan view 400 of FIG. 4, a first protection layer 304 is formed and patterned on a sacrificial layer 302 over a substrate 102. The substrate 102 is prepared and provided having a device layer 108 disposed thereover and a masking layer 110 disposed on the device layer 108. The masking layer 110 is arranged on the device layer 108 for patterning the device layer 108 later. In some embodiments, the device layer 108 and the masking layer 110 may contain multiple layers and structures made of different materials. For example, similar to what is shown in FIG. 1, the device layer 108 may comprise a top electrode 126 and a bottom electrode 122 separated by a resistance switching dielectric 124. the masking layer 110 may comprise a first silicon nitride (SiN) layer 128, an amorphous carbon (APF) layer 130 disposed over the first SiN layer 128, and a second silicon nitride (SiN) layer 132 disposed over the APF layer 130. In some embodiments, the first protection layer 304 is a photoresist and can be formed by spin-on or coating techniques and can be patterned using a photolithographic mask 10. The first protection layer 304 is shown as a negative photoresist layer, where the exposed portions of the first protection layer 304 not protected by the photolithographic mask 10 become difficult to be dissolved in the photolithographic developer solution, and stay on the sacrificial layer 302 after developing. But it is appreciated that an opposite positive photoresist layer can also be used as the first protection layer 304, in which case the photolithographic mask 10 has opposite openings and blocks. In some embodiments, the sacrificial layer 302 is may be formed by a vapor deposition technique (e.g., physical vapor deposition, chemical vapor deposition, plasma-enhanced CVD (PECVD) etc.). In some embodiments, the sacrificial layer 302 is made of amorphous silicon, amorphous carbon, APF, ashing removable dielectric (ARD), or the combination thereof. The photolithographic mask 10 has mandrel openings 306 and a mark opening 308 respectively having widths W1 and W2. The first protection layer 304 is patterned to form a first portion 304a having a target shape and a second portion 304b having a mark shape. In some embodiments, as shown in FIG. 4, the first portion 304a includes a plurality of lines one spaced from another. The second portion 304b is shown as a cross shape, but can be any applicable shape for marking purpose, such as a plurality of lines with different distances, polygons, etc. The layout out the first portion 304a is illustration and non-limiting purposes, and only some elements of the first portion 304a are labeled for simplicity reason.

Figure 5:
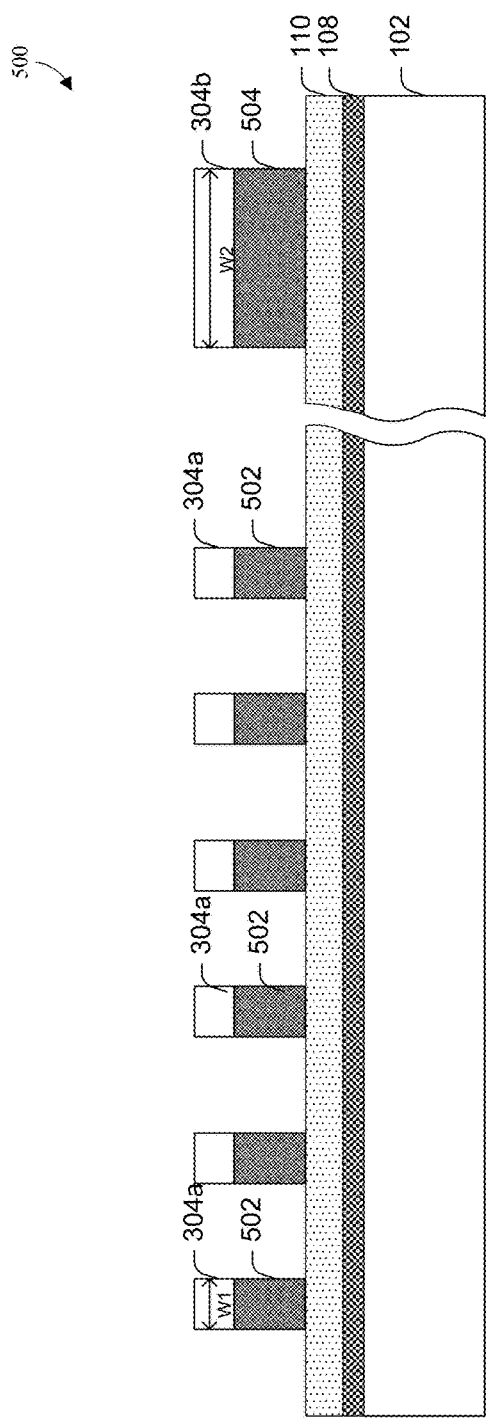
Figure 6:
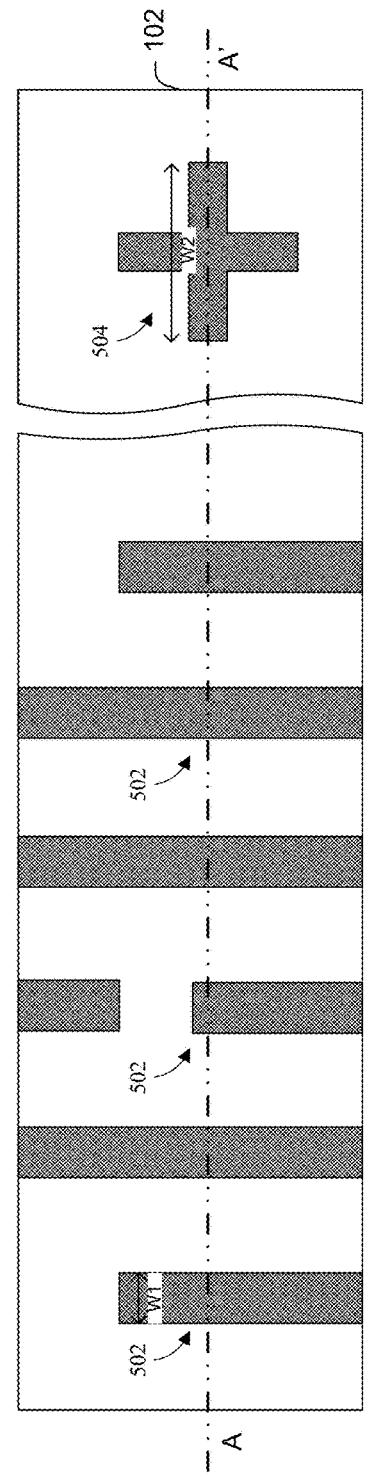

As shown in cross-sectional view 500 of FIG. 5 and plan view 600 of FIG. 6, the sacrificial layer 302 (see FIG. 3) is patterned. As shown in FIG. 5, the sacrificial layer 302 (see FIG. 3) is patterned according to the first protection layer 304 (first portion 304a and the second portion 304b) to form a plurality of mandrels 502 and a mandrel mark 504 next to the plurality of mandrels 502. It is also noted that only some elements of the mandrels 502 are labeled for simplicity reason. In some embodiments, a series of etching processes is used to pattern the mandrels 502 and the mandrel mark 504, thereby resulting in the sidewalls of the mandrels 502 and the mandrel mark 504 vertically aligned with the sidewall of the first and second portions 304a, 304b of the first protection layer 304. In some embodiments, the plurality of mandrels 502 and the mandrel mark 504 are concurrently formed by a first photolithographic process that includes exposing and developing a first photoresist through a first lithographic mask and etching the sacrificial layer 302 according to the developed first photoresist. The first lithographic mask includes openings corresponding to the plurality of mandrels 502 and the mandrel mark 504.

As shown in cross-sectional view 700 of FIG. 7 and plan view 800 of FIG. 8, spacers 702 are formed along peripheries of the mandrels 502 and the mandrel mark 504 including along respective sides 704 and ends 706 of the mandrels 502. In some embodiments, the spacers 702 are formed by depositing a dielectric spacer layer on an upper surface of the masking layer 110, extending along sidewall surfaces of the mandrels 502 and the mandrel mark 504, and covering a top surface of the mandrels 502 and the mandrel mark 504. Then an anisotropic etch (e.g. a vertical etch) may be performed to the dielectric spacer layer to remove lateral stretches of the dielectric spacer layer, thereby resulting in the spacers 702 disposed along sidewalls of the mandrels 502 and the mandrel mark 504. In some embodiments, the spacers 702 may have a conformal vertical shape and respectively have an uppermost tip reaching a top surface of the mandrels 502 and the mandrel mark 504. The spacers 702 may respectively have a lateral width that is smaller than that of the mandrels 502. The material of the spacers 702 may be highly selective to an etchant relative to the material of the mandrels 502 and the mandrel mark 504, such that the mandrels 502 and the mandrel mark 504 can be selectively removed with the spacers 702 stay in place in a subsequent process. The dielectric spacer layer may comprise silicon nitride, tetraethyl orthosilicate (TEOS), silicon-rich oxide (SRO), or a similar composite dielectric film. In some embodiments, the dielectric spacer layer may be formed by a vapor deposition technique (e.g., physical vapor deposition, chemical vapor deposition, etc.). Again, only some elements of the spacers 702 are labeled for simplicity reason.

Figure 9:
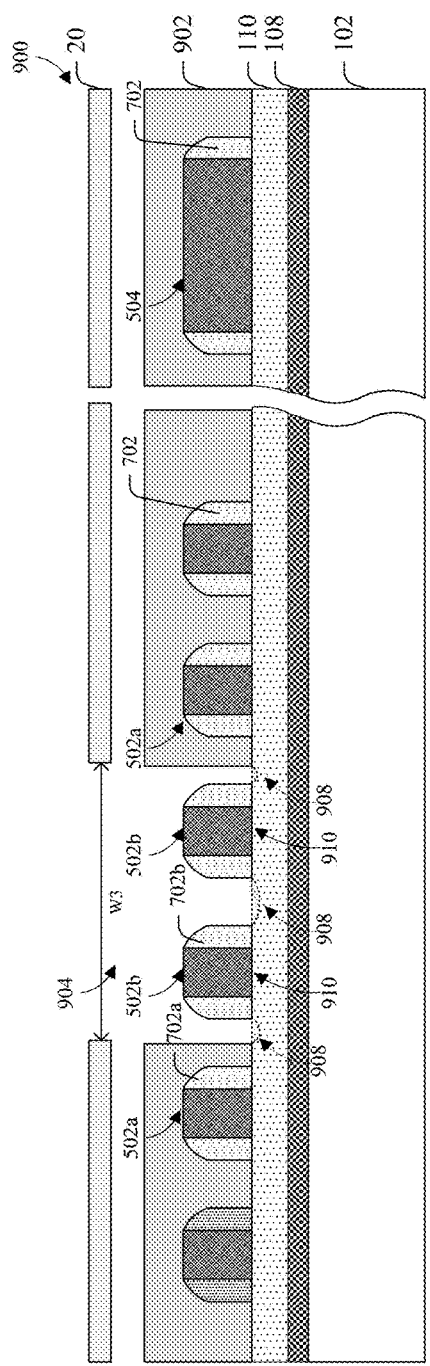
Figure 10:
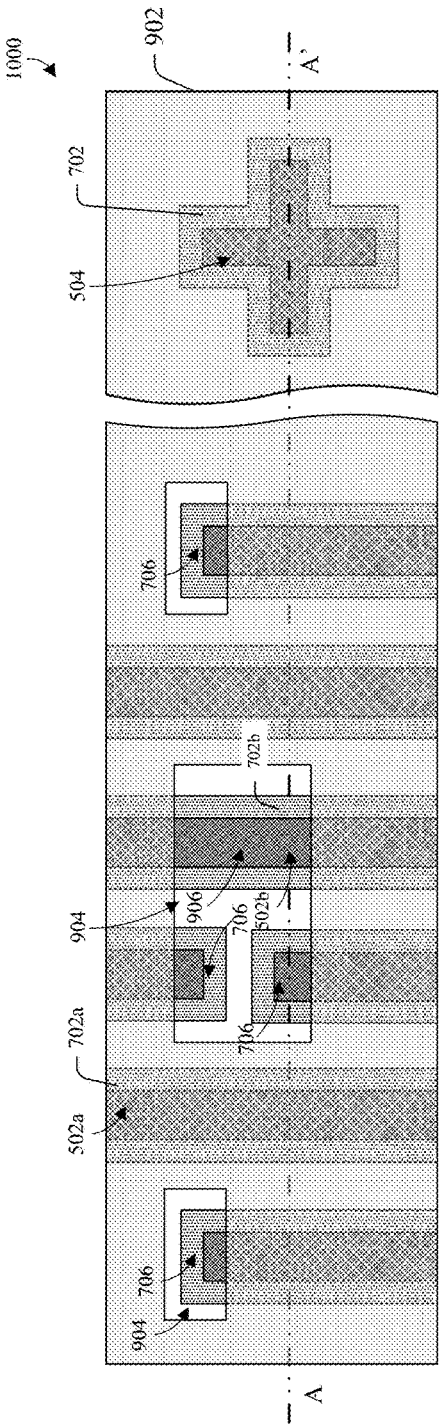

As shown in cross-sectional view 900 of FIG. 9 and plan view 1000 of FIG. 10, a second protection layer 902 is formed to cover portions of the plurality of mandrels 502a and corresponding portions of the spacers 702a and the mandrel mark 504 and to expose the ends 706 and unwanted portions 906 of the plurality of mandrels 502b and corresponding portions of the spacers 702b. In some embodiments, the second protection layer 902 is a second photoresist and can be patterned using a second photolithographic mask 20. In some embodiments, the second protection layer 902 is a positive photoresist layer, where the exposed portions of the second protection layer 702 not protected by the second photolithographic mask 20 become dissolvable in the photolithographic developer solution, and are removed after developing. The photolithographic mask 20 has a line cut opening 904 having a width W3. The width W3 may be greater than the width W1, e.g., two or three times greater than the width W1. The second protection layer 902 defines termini of the target to be formed. In some embodiments, the second photolithographic mask 20 is aligned to the features of the work piece by the mandrel mark 504 and portions of the spacers 702 surrounding the mandrel mark 504. In comparison, as an alternate approach, the mandrels 502a, 502b can be firstly removed together with the mandrel mark 504 to leave the spacers standing on their own before forming and patterning the second protection layer 902. In this approach, the second photolithographic mask 20 is aligned by the portions of the spacers 702 surrounding the mandrel mark 504 as the mark (which is removed when doing the second photolithographic mask alignment). The second protection layer 902 overlies the work piece, the mark made of the spacer material is hard to be distinguished since the second protection layer 902 and the spacer material may have similar color. In contrast, the mandrel mark 504 may have a color darker than that of the second protection layer. Thereby, by using the mandrel mark 504 as the mark for the second photolithographic mask 20 alignment, contrast is increased, and robust photo alignment signal for the line cut photolithography and precise positioning of the line termini mask can be achieved. As an example, the mark using the mandrel mark 504 may be improved by around 7% compared to using a mark with spacers 702 only but not the mandrel mark 504. It is also appreciated by the applicants that only increasing a thickness of the spacers 702 is insufficient to provide robust photo alignment. For example, increasing a thickness of the spacers 702 by around 25% (e.g., from 400 Å to 500 Å only increase the alignment by 0.012%)

Figure 11:
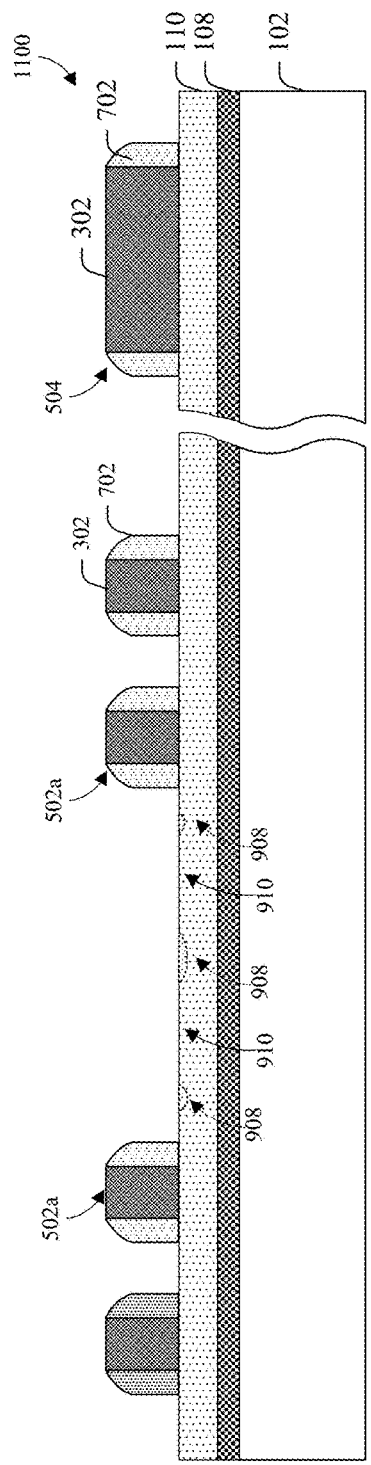
Figure 12:
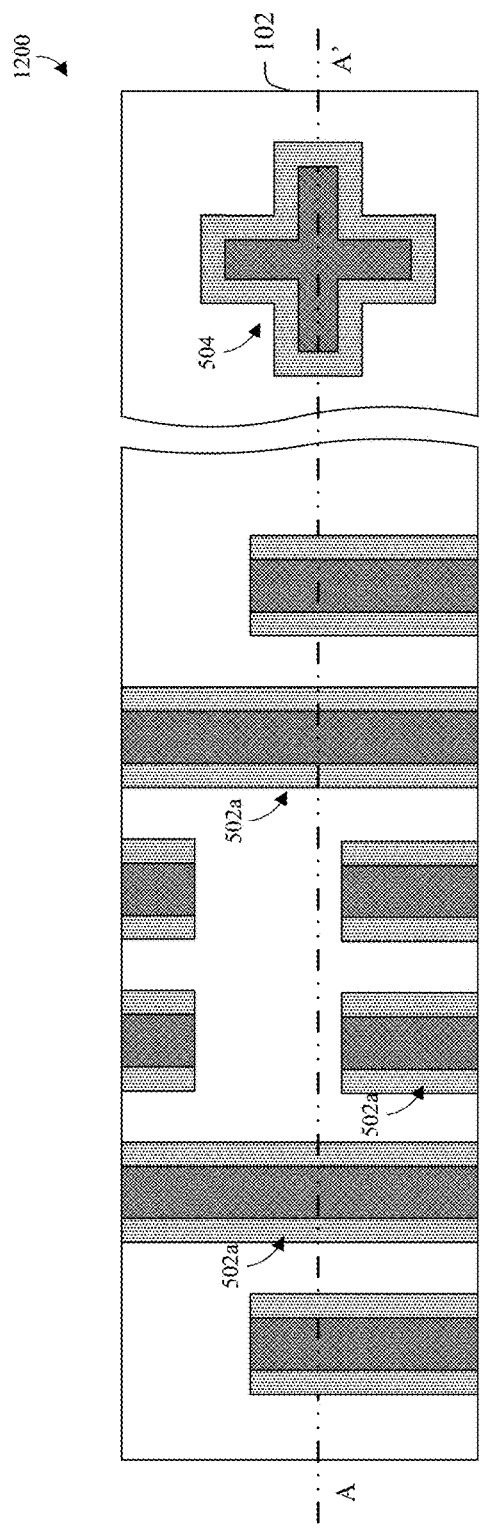

As shown in cross-sectional view 1100 of FIG. 11 and plan view 1200 of FIG. 12, the mandrels 502 and the spacers 702 are patterned according to the second protection layer 902. The exposed portions of the mandrels 502b and the spacers 702b are removed by one or more etching processes, including the ends 706 and unwanted portions 906 (see FIG. 10) of the plurality of mandrels 502b and corresponding portions of the spacers 702b. The etching processes may include dry etching processes and/or wet etching processes. In some embodiments, the mandrel mark 504 and the corresponding portions of the spacers 702 are protected by the second protection layer 902 from being removed. In some embodiments, some top surface portions 908 of the masking layer 110 not protected by the second protection layer 902 or the mandrels 502b and the spacers 702b are altered by the etching processes, while some other top surface portions 910 between the opposing spacers 702b are protected by the mandrels 502b. In comparison, resulting by some other processing methods, such as the alternative approach discussed above, where the mandrels 502b are removed before the line cut patterning process, the top surface portions 910 are not covered by the mandrels 502b during the patterning process and will be altered similar as the top surface portions 908.

As shown in cross-sectional view 1300 of FIG. 13 and plan view 1400 of FIG. 14, the remaining mandrels 502 are removed. The mandrels 502 may be removed by one or more etching processes including dry etching and/or wet etching processes.

Figure 15:
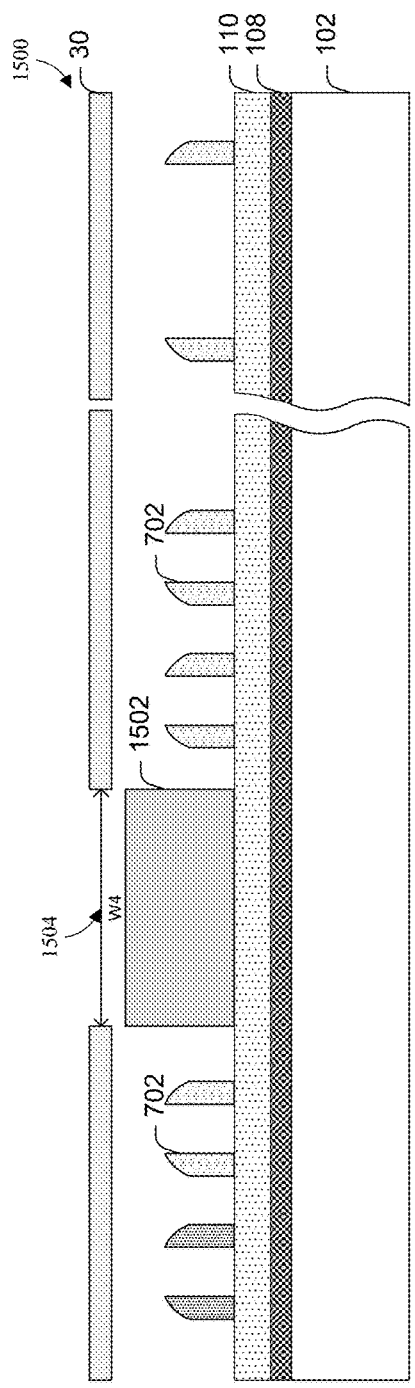
Figure 16:
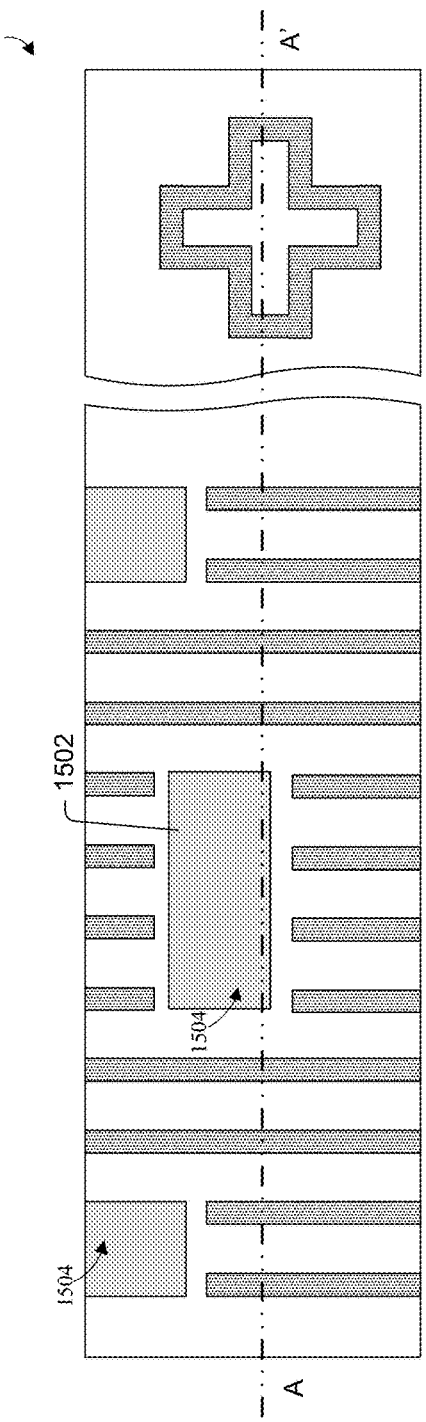

As shown in cross-sectional view 1500 of FIG. 15 and plan view 1600 of FIG. 16, a dummy protection layer 1502 is formed next to the remaining spacers 702 over a planar opening 1504 of the masking layer 110. In some embodiments, the dummy protection layer 1502 is a third photoresist and can be patterned using a third photolithographic mask 30. The dummy protection layer 1502 is shown as a negative photoresist layer, where the exposed portions of the dummy protection layer 1502 not protected by the photolithographic mask 30 become difficult to be dissolved in the photolithographic developer solution, and stay on the masking layer 110 after developing. But it is appreciated that an opposite positive photoresist layer can also be used as the dummy protection layer 1502, in which case the photolithographic mask 30 has opposite openings and blocks. The photolithographic mask 30 has a planar opening 1504 having a width W4. In some embodiments, the width W4 may be greater than the width W1, e.g., two or three times greater than the width W1. The planar opening 1504 may also have an area greater than that of the line cut opening 904 shown in FIG. 10.

Figure 17:
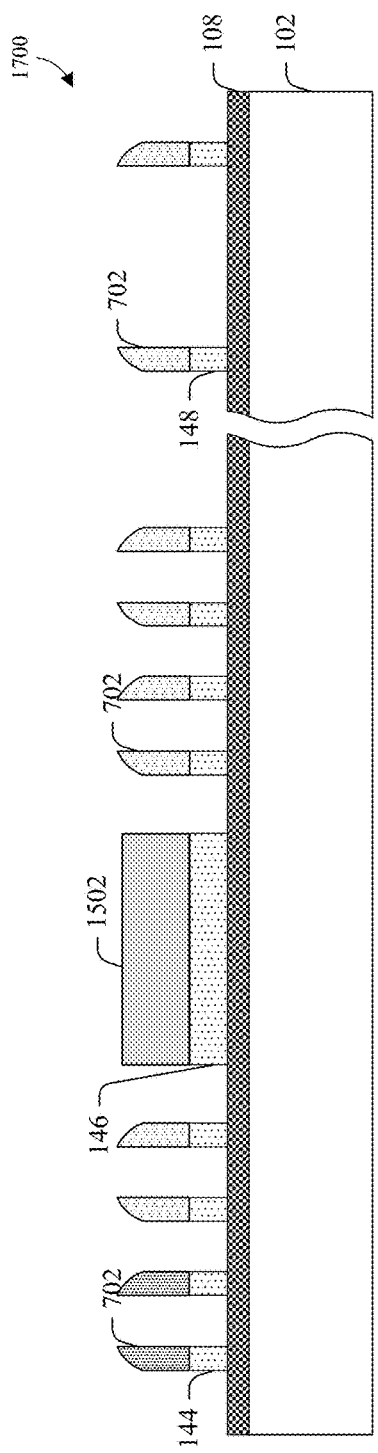
Figure 18:
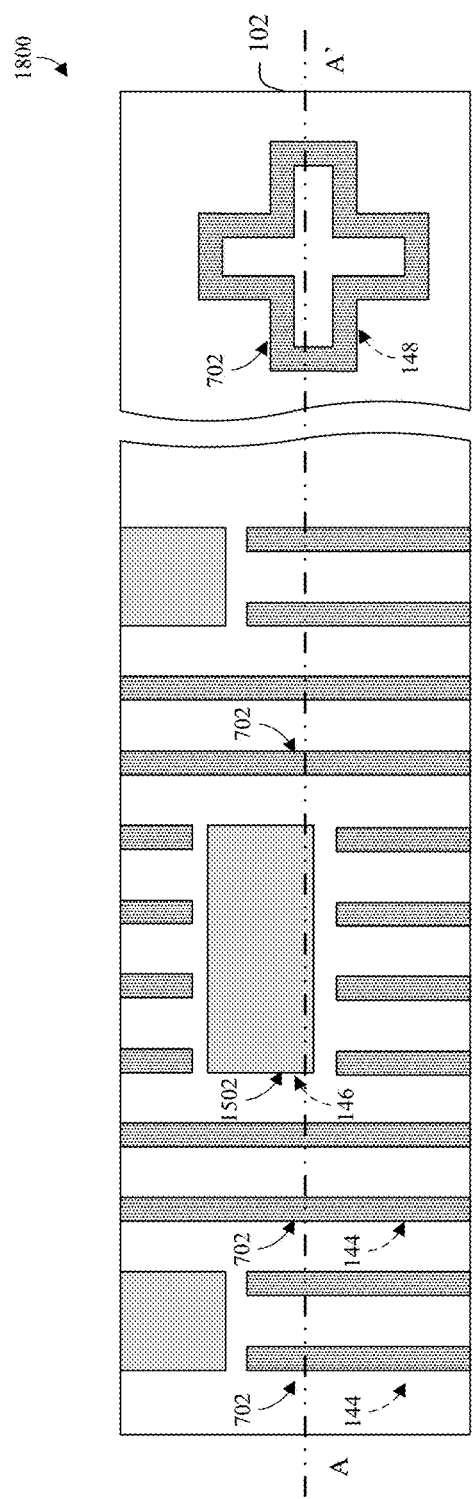

As shown in cross-sectional view 1700 of FIG. 17 and plan view 1800 of FIG. 18, the masking layer 110 is patterned according to the remaining spacers 702 and dummy protection layer 1502 to form a device mask 144, a dummy mask 146, and a mask level mark 148 over the substrate 102.

Figure 19:
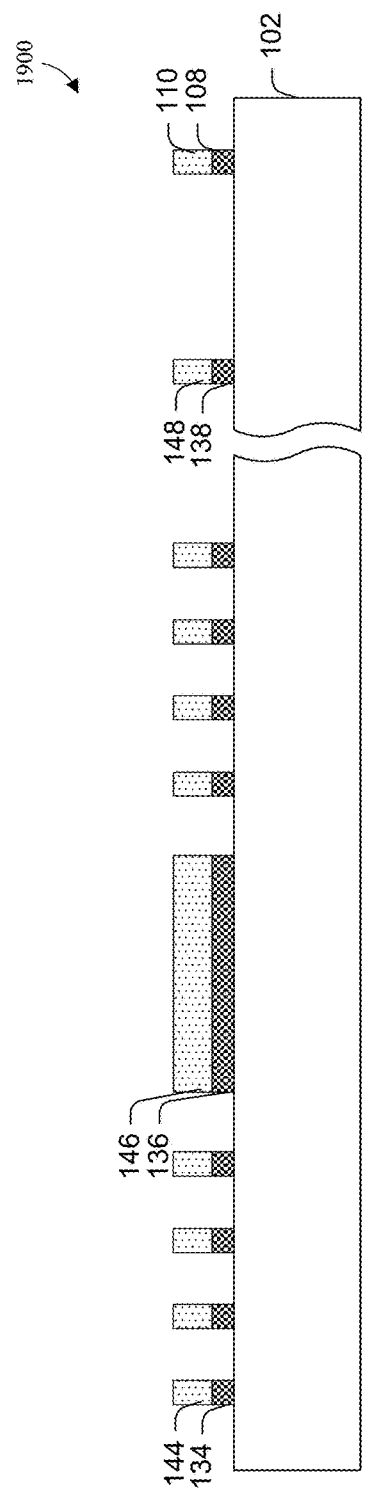
Figure 20:
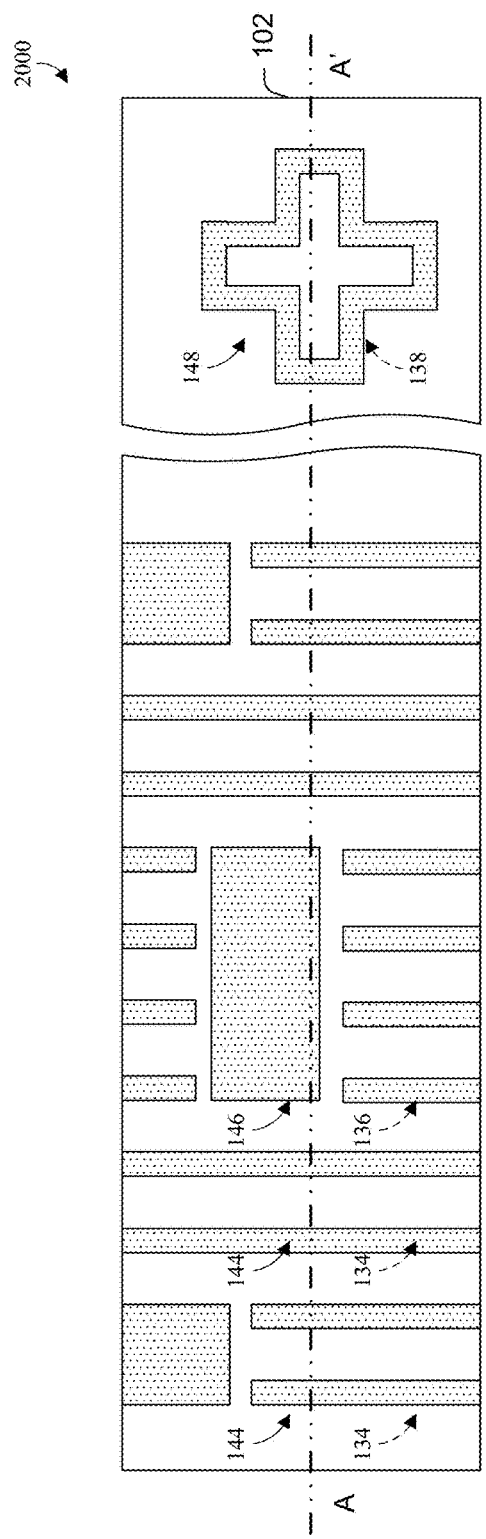

As shown in cross-sectional view 1900 of FIG. 19 and plan view 2000 of FIG. 20, the device layer 108 is patterned according to the device mask 144, the dummy mask 146, and the mask level mark 148 to form a device structure 134, a dummy structure 136, and a device level mark structure 138.

Figure 21:
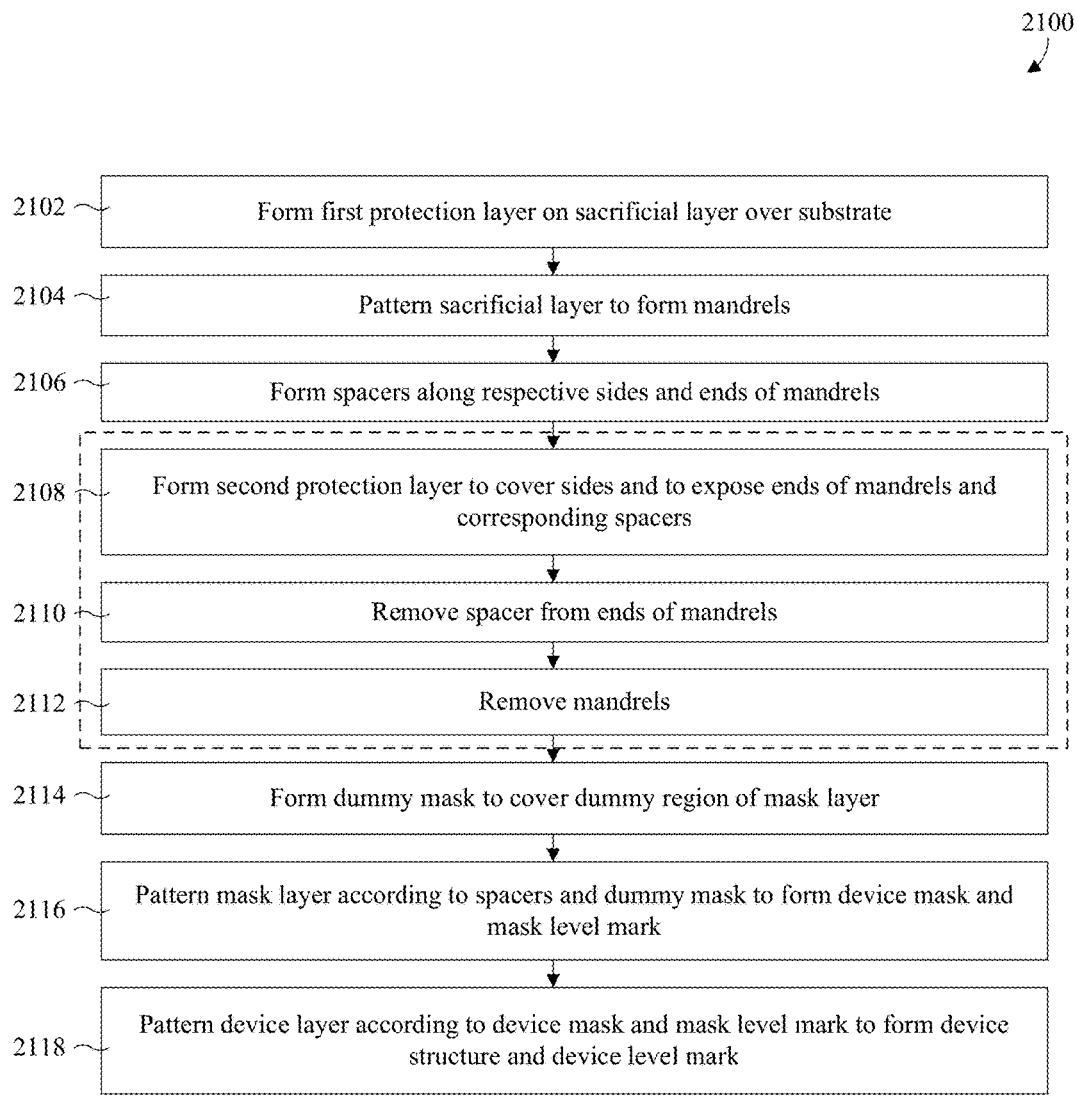
FIG. 21 illustrates a flow chart of an integrated circuit manufacturing process according to some embodiment.

FIG. 21 shows some embodiments of a flow diagram of a method 2100 of forming an integrated circuit device. Although method 2100 is described in relation to FIGS. 3-20, it will be appreciated that the method 2100 is not limited to such structures disclosed in FIGS. 3-20, but instead may stand alone independent of the structures disclosed in FIGS. 3-20. Similarly, it will be appreciated that the structures disclosed in FIGS. 3-20 are not limited to the method 2100, but instead may stand alone as structures independent of the method 2100. Also, while disclosed methods (e.g., method 2100) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, a first protection layer is formed on a sacrificial layer over a substrate. FIG. 3 and FIG. 4 show some embodiments of a cross-sectional view 300 and a plan view 400 corresponding to act 2102.

At act 2104, the sacrificial layer is patterned to form mandrels. FIG. 5 and FIG. 6 show some embodiments of a cross-sectional view 500 and a plan view 600 corresponding to act 2104.

At act 2106, spacers are formed along respective sides and ends of mandrels. FIG. 7 and FIG. 8 show some embodiments of a cross-sectional view 700 and a plan view 800 corresponding to act 2106.

At act 2108, a second protection layer is formed to cover the sides and to expose the ends of the mandrels and corresponding spacers. The mandrels and the spacers at the mark region collectively serve as the mark for the second photolithographic mask alignment, thus robust photo alignment signal for the line cut photolithography and precise positioning of the line termini mask can be achieved. FIG. 9 and FIG. 10 show some embodiments of a cross-sectional view 900 and a plan view 1000 corresponding to act 2108.

At act 2110, the spacer is removed from the ends of mandrels. FIG. 11 and FIG. 12 show some embodiments of a cross-sectional view 1100 and a plan view 1200 corresponding to act 2110.

At act 2112, the mandrels are removed. FIG. 13 and FIG. 14 show some embodiments of a cross-sectional view 1300 and a plan view 1400 corresponding to act 2112.

At act 2114, a dummy mask is formed to cover dummy region of the mask layer. FIG. 15 and FIG. 16 show some embodiments of a cross-sectional view 1500 and a plan view 1600 corresponding to act 2114.

At act 2116, the mask layer is patterned according to the spacers and the dummy mask to form a device mask and a mask level mark. FIG. 17 and FIG. 18 show some embodiments of a cross-sectional view 1700 and a plan view 1800 corresponding to act 2116.

At act 2118, the device layer is patterned according to the device mask and the mask level mark to form a device structure and a device level mark structure. FIG. 19 and FIG. 20 show some embodiments of a cross-sectional view 1900 and a plan view 2000 corresponding to act 2118.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

Thus, as can be appreciated from above, the present disclosure provides a method of manufacturing an integrated circuit (IC). The method comprises providing a substrate having a masking layer over the substrate and a sacrificial layer over the masking layer and forming and patterning a first protection layer on the sacrificial layer. The method further comprises patterning the sacrificial layer to form a plurality of mandrels and a mandrel mark next to the plurality of mandrels and forming spacers along peripheries of the mandrels and the mandrel mark including along respective sides and ends of the mandrels. The method further comprises forming a second protection layer to cover portions of the mandrels and spacers and the mandrel mark and to expose the ends of the plurality of mandrels and corresponding portions of the spacers and removing the exposed ends of the plurality of mandrels and corresponding spacers. The method further comprises removing the remaining mandrels. The method further comprises forming a dummy protection layer next to the remaining spacers over a dummy region of the masking layer and patterning the masking layer according to the remaining spacers and dummy protection layer to form a device mask, a dummy mask, and a mask level mark over the substrate.

In another embodiment, the present disclosure relates to a method of manufacturing an integrated circuit (IC). The method comprises forming a masking layer over a substrate and a sacrificial layer over the masking layer. The method further comprises patterning the sacrificial layer to form a plurality of mandrels and a mandrel mark next to the plurality of mandrels and forming spacers along peripheries of the mandrels and the mandrel mark. The method further comprises performing a line cut process to remove portions of spacers and mandrels and to define termini of the mandrels and removing the remaining mandrels. The method further comprises patterning the masking layer according to the remaining spacers to form a device mask over the substrate.

In yet another embodiment, the present disclosure relates to a method of manufacturing an integrated circuit (IC). The method comprises forming a masking layer over a substrate and forming a plurality of mandrels and a mandrel mark over the masking layer. The method further comprises forming spacers along peripheries of the mandrels and the mandrel mark. The method further comprises using the mandrel mark and the spacers along sides of the mandrel mark as an alignment marker, performing a photolithographic process to protect selective portions of the spacers and mandrels from removal and removing unprotected portions of the spacers and mandrels. The method further comprises removing the remaining mandrels and patterning the masking layer according to the remaining spacers to form a device mask over the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device, comprising:
   providing a substrate having a masking layer over the substrate and a sacrificial layer over the masking layer;
   forming and patterning a first protection layer on the sacrificial layer;
   patterning the sacrificial layer to form a plurality of mandrels and a mandrel mark next to the plurality of mandrels;
   forming spacers along peripheries of the mandrels and the mandrel mark including along respective sides and ends of the mandrels;
   forming a second protection layer to cover a first portion of the mandrels and the mandrel mark and to expose a second portion of the mandrels;
   removing the exposed second portion of the mandrels and the spacers along respective sides and ends of the second portion of the mandrels;
   removing the first portion of the mandrels while leaving the spacers along respective sides of the first portion of the mandrels;
   forming a dummy protection layer next to the remaining spacers over a dummy region of the masking layer; and
   patterning the masking layer according to the remaining spacers and the dummy protection layer to form a device mask, a dummy mask, and a mask level mark over the substrate.

2. The method of claim 1, further comprising:
   forming a device layer over the substrate prior to forming the masking layer, wherein the masking layer is then formed on the device layer; and
   patterning the device layer according to the device mask and the mask level mark to form a device structure and a device level mark structure.

3. The method of claim 1, wherein the plurality of mandrels and the mandrel mark are concurrently formed by a first photolithographic process that includes exposing and developing a first photoresist through a first lithographic mask and etching the sacrificial layer according to the developed first photoresist, wherein the first lithographic mask includes openings corresponding to the plurality of mandrels and the mandrel mark.

4. The method of claim 3, wherein the second protection layer is formed by performing a second photolithographic process that includes exposing and developing a second photoresist through a second lithographic mask, wherein the second lithographic mask is aligned by locating the mandrel mark and corresponding portions of the spacers.

5. The method of claim 4, wherein forming a second protection layer comprises forming a positive photoresist layer and patterning the positive photoresist layer using a second photolithographic mask.

6. The method of claim 4, wherein the dummy protection layer is formed by performing a third photolithographic process that includes exposing and developing a third photoresist through a third lithographic mask.

7. The method of claim 6, wherein the third lithographic mask is aligned to the remaining portions of the spacers.

8. The method of claim 1, wherein the removing the first portion of the mandrels further comprises removing the mandrel mark together with the first portion of the mandrels.

9. The method of claim 1, wherein the spacers are formed by depositing a spacer material followed by performing an anisotropic etch to the spacer material.

10. The method of claim 1, wherein openings of the second protection layer determine endpoints of the device mask.

11. The method of claim 1, wherein the masking layer is made of a first silicon nitride (SiN) layer, an amorphous carbon (APF) layer over the first SiN layer, and a second silicon nitride (SiN) layer over the APF layer.

12. The method of claim 1, wherein the sacrificial layer is made of amorphous silicon, APF, ashing removable dielectric (ARD), or the combination thereof.

13. A method of forming an integrated circuit device, comprising:
   forming a masking layer over a substrate and a sacrificial layer over the masking layer;
   patterning the sacrificial layer to form a plurality of mandrels and a mandrel mark next to the plurality of mandrels;
   forming spacers along peripheries of the mandrels and the mandrel mark;
   using the mandrel mark and the spacers along sides of the mandrel mark, performing a line cut process to remove a first portion of the mandrels and the spacers along sides of the first portion of the mandrels;
   removing the remaining mandrels; and
   patterning the masking layer according to the remaining spacers to form a device mask over the substrate.

14. The method of claim 13, further comprising:
   prior to patterning the masking layer, forming a dummy protection layer next to the remaining spacers over a dummy region of the masking layer, wherein the masking layer is patterned according to the dummy protection layer to form a dummy mask over the substrate.

15. The method of claim 13, wherein the line cut process includes performing a second photolithographic process to protect selective portions of the spacers and mandrels from removal and removing unprotected portions of the spacers and mandrels, wherein the second photolithographic process is aligned by locating the mandrel mark and corresponding portions of the spacers.

16. The method of claim 15,
   wherein the second photolithographic process protects the mandrel mark and corresponding spacers from removal; and
   wherein the mandrel mark is removed when removing the remaining mandrels.

17. The method of claim 16, wherein patterning the masking layer also forms a mask level mark over the substrate together with the device mask.

18. The method of claim 13,
   wherein the mandrels have line-shaped features spaced one from another by gaps; and
   wherein the mandrels and the gaps respectively have widths greater than that of the spacers.

19. A method of forming an integrated circuit device, comprising:
   forming a masking layer over a substrate;
   forming a plurality of mandrels and a mandrel mark over the masking layer;
   forming spacers along peripheries of the mandrels and the mandrel mark;
   using the mandrel mark and the spacers along sides of the mandrel mark as an alignment marker, performing a photolithographic process to protect selective portions of the spacers and mandrels from removal and removing unprotected portions of the spacers and mandrels;

removing the remaining mandrels; and patterning the masking layer according to the remaining spacers to form a device mask over the substrate.

20. The method of claim 19, further comprising:

prior to patterning the masking layer, forming a dummy protection layer next to the remaining spacers over a dummy region of the masking layer, wherein the masking layer is patterned according to the dummy protection layer together with the remaining spacers to form a dummy mask together with a device mask over the substrate.

* * * * *